United States Patent
Le et al.

(10) Patent No.: US 6,756,655 B2
(45) Date of Patent: Jun. 29, 2004

(54) FUSE FOR A SEMICONDUCTOR CONFIGURATION AND METHOD FOR ITS PRODUCTION

(75) Inventors: Thoai-Thai Le, Cary, NC (US); Jürgen Lindolf, Friedberg (DE)

(73) Assignee: Infineon Technologies AG, Munich (DE)

( * ) Notice: Subject to any disclaimer, the term of this patent is extended or adjusted under 35 U.S.C. 154(b) by 101 days.

(21) Appl. No.: 10/013,298

(22) Filed: Dec. 10, 2001

(65) Prior Publication Data

US 2002/0084508 A1 Jul. 4, 2002

Related U.S. Application Data

(63) Continuation of application No. PCT/DE00/01867, filed on Jun. 6, 2000.

(30) Foreign Application Priority Data

Jun. 8, 1999 (DE) .......................................... 199 26 107

(51) Int. Cl.[7] .............................................. H01L 29/00
(52) U.S. Cl. ........................ 257/529; 257/530; 257/209
(58) Field of Search ................................ 257/529, 209, 257/530

(56) References Cited

U.S. PATENT DOCUMENTS 3,863,231 A    1/1975   Taylor
5,166,901 A  * 11/1992   Shaw et al. .................. 365/105
6,218,279 B1 *  4/2001   Weber et al. ................ 438/601

FOREIGN PATENT DOCUMENTS

EP          0 903 784 A2    3/1999
JP          58 033 865      2/1983

* cited by examiner

*Primary Examiner*—Phat X. Cao
(74) *Attorney, Agent, or Firm*—Laurence A. Greenberg; Werner H. Stemer; Gregory L. Mayback

(57) ABSTRACT

A semiconductor configuration is described which includes a semiconductor body having a main surface and an insulator layer disposed on the main surface of the semiconductor body. The insulator layer has a cavity formed therein extending to the main surface of the semiconductor body. A fuse having a fusible part extends from the main surface of the semiconductor body toward an upper surface of the insulator layer at right angles to the main surface of the semiconductor body, and the fuse is embedded in the cavity. A method for producing the semiconductor configuration having the fuse is also described.

7 Claims, 1 Drawing Sheet

FUSE FOR A SEMICONDUCTOR CONFIGURATION AND METHOD FOR ITS PRODUCTION

CROSS-REFERENCE TO RELATED APPLICATION

This application is a continuation of copending International Application No. PCT/DE00/01867, filed Jun. 6, 2000, which designated the United States.

BACKGROUND OF THE INVENTION

Field of the Invention

The present invention relates to a fuse for a semiconductor configuration having a semiconductor body with two main surfaces running essentially parallel to one another.

As is known, the use of fuses in semiconductor configurations and, in particular, in semiconductor memories is becoming increasingly important. They are used to connect appropriate substitute elements or redundant elements, such as memory cells or word lines, when individual elements fail. If, for example, a word line is found to be faulty when testing a semiconductor memory, then a redundant word line is activated instead of the faulty word line, by disconnecting or blowing fuses. Chip options can also be connected via fuses, for example.

There are now two different ways to disconnect fuses: in the first way, the disconnection is carried out by the action of a laser beam, and this is what is referred to as a laser fuse. In the second way, the disconnection is carried out by electrical destruction resulting from the production of heat; this is an electrical fuse, or E-fuse.

Both fuse types have the common feature that they are produced only in planar form (see, for example, U.S. Pat. Nos. 5,663,590 and 5,731,624). Therefore the contacts of a fuse lie in a plane, which runs essentially parallel to a main surface of the semiconductor body of a semiconductor configuration, that is to say, for example, of a semiconductor memory. Such a structure has first contacts and second contacts, which are each disposed on conductive areas, which are composed, for example, of highly doped silicon. The areas are electrically connected to one another by a fuse, which represents a conductive connection between the areas. The fuse may, for example, be composed of doped polycrystalline silicon, or else of metal. The fuse itself has a fine form, and has a width in the order of magnitude of a few $\mu$m down to less than 1 $\mu$m.

If a current which is greater than a certain limit value now flows between the contacts, then the fuse is destroyed by the resistive heat produced by the current flow. Therefore, the fuse is blown. The programming voltage is in this case greater than the operating voltage of the chip. The magnitude of the programming voltage is dependent, inter alia, on the width of the fuses.

The process of blowing a fuse can also, of course, be carried out by the influence of a laser beam, and this is particularly expedient when the fuse is located on the surface of a semiconductor configuration.

The fuse together with the associated contacts requires an area that is not negligible on a semiconductor chip. The area required for fuses is a disadvantageous factor in terms of the continuous aim to miniaturize semiconductor configurations. This applies in particular to semiconductor memories, since a large number of fuses are required in them.

SUMMARY OF THE INVENTION

It is accordingly an object of the invention to provide a fuse for a semiconductor configuration and a method for its production which overcomes the above-mentioned disadvantages of the prior art devices and methods of this general type, which is distinguished by a minimal area requirement; and in order to keep the programming voltage low, it should be possible to set the diameter of the fuse to values which are significantly less than 1 $\mu$m.

With the foregoing and other objects in view there is provided, in accordance with the invention, a semiconductor configuration. The semiconductor configuration includes a semiconductor body having a main surface and an insulator layer disposed on the main surface of the semiconductor body and has an upper surface. The insulator layer has a cavity formed therein extending to the main surface of the semiconductor body. A fuse having a fusible part extends from the main surface of the semiconductor body toward the upper surface of the insulator layer at right angles to the main surface of the semiconductor body, and the fuse is embedded in the cavity.

In the case of the fuse for the semiconductor configuration having the semiconductor body with two main surfaces running essentially parallel to one another, the object is achieved, according to the invention, by the fuse extending in the direction between the two main surfaces and being embedded in the cavity in the semiconductor body.

The fuse according to the invention is thus not, like all the existing fuses, disposed in a planar structure. In fact, it is provided in the "vertical" direction between the two main surfaces of the semiconductor configuration. This factor on its own achieves a considerable reduction in area, so that it is possible to achieve a considerably improved packing density for semiconductor configurations with fuses. In addition, the diameter of the fuses can be set without any problems to values of considerably less than 1 $\mu$m, and this results in low programming voltages.

The enclosure of the fuses in the cavity has a further advantageous effect, which can be achieved only with major complexity and a large space requirement with the previous planar fuses. When the fuses are destroyed, the melt that is produced cannot produce any undesirable short circuits due to vapor-deposited material, since the vapors are reliably enclosed in the cavity. There is therefore no need for any special measures in order to avoid short circuits, which can occur when planar fuses are destroyed. Such measures with existing fuses contain the maintenance of specific minimum distances to adjacent elements or other fuses, or the provision of protective ring structures around the fuses.

A method for producing the fuse according to the invention is distinguished, by method steps which includes applying an insulator layer, which is etched selectively with respect to a semiconductor substrate and is composed, for example, of silicon nitride, is applied to the semiconductor substrate, which is composed, for example, of silicon. The insulator layer and the semiconductor substrate are then anisotropically structured, so that a semiconductor area in the form of a column remains under the remaining insulator layer after structuring. The column-shaped semiconductor layer is then isotropically etched over, in which case the width and electrical characteristics of the fuse can be set without any problems in this step. A dielectric composed, for example, of silicon dioxide is anisotropically applied to the remaining structure, which can be done by vapor deposition, and as a result of which a cavity is formed.

Contact is then made with the fuse that has been produced in the normal way, once again, as well as with its metallization, with subsequent passivation. A buried layer contact may be used if required for making contact, and this contributes to a further improvement in the packing density.

The fuse itself is advantageously composed of doped or undoped silicon. In this case, it may have a length of up to a few μm and a diameter of about 0.1 to 0.5 μm.

At its end facing the semiconductor body, the fuse makes contact, for example, with a buried layer, as has already been explained above, while, at its opposite end, which is located in the vicinity of one main surface of the semiconductor body, a metallic contact can be provided, composed, for example, of tungsten with appropriate contact diffusion. Such a tungsten contact can then be connected to an interconnect composed, for example, of aluminum, tungsten or polycrystalline silicon.

Other features which are considered as characteristic for the invention are set forth in the appended claims.

Although the invention is illustrated and described herein as embodied in a fuse for a semiconductor configuration and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
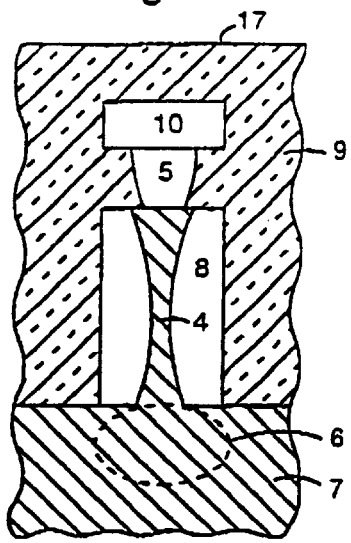
FIG. 1 is a diagrammatic, sectional view through a fuse according to the invention.

In all the figures of the drawing, sub-features and integral parts that correspond to one another bear the same reference symbol in each case. Referring now to the figures of the drawing in detail and first, particularly, to FIG. 6 thereof, there is shown a structure having first contacts 1 and second contacts 2, which are each disposed on conductive areas 3, which are composed, for example, of highly doped silicon. The areas 3 are electrically connected to one another by a fuse 4, which represents a conductive connection between the areas 3. The fuse 4 may, for example, be composed of doped polycrystalline silicon, or else of metal. The fuse 4 itself has a fine form, and has a width in the order of magnitude of a few μm down to less than 1 μm.

If a current which is greater than a certain limit value now flows between the contacts 1 and 2, then the fuse 4 is destroyed by the resistive heat produced by the current flow. Therefore, the fuse is blown. The programming voltage is in this case greater than the operating voltage of the chip. The magnitude of the programming voltage is dependent, inter alia, on the width of the fuse 4.

The process of blowing the fuse 4 can also, of course, be carried out by the influence of a laser beam, and this is particularly expedient when the fuse 4 is located on the surface of a semiconductor configuration.

Figure 6:
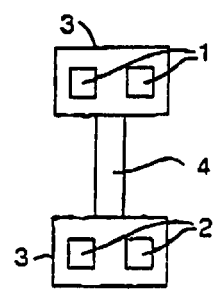
FIG. 6 is a plan view of a prior art planar fuse.

As is now immediately evident from FIG. 6, the fuse 4 together with the associated contacts 1, 2 requires an area that is not negligible on a semiconductor chip. The area required for fuses is a disadvantageous factor in terms of the continuous aim to miniaturize semiconductor configurations. This applies in particular to semiconductor memories, since a large number of fuses are required in them.

FIG. 1 shows the fuse 4 composed of silicon according to the invention. The fuse 4 has a length of about 1 to 2 μm and, at its narrowest point, a diameter of about 0.1 to 0.2 μm, and which extends between a contact 5 composed, for example, of tungsten, and a buried layer 6 in a semiconductor body 7. The fuse 4 is in this case disposed in a cavity 8, which is surrounded by an insulator layer 9 composed, for example, of silicon dioxide, in which an interconnect 10 composed of aluminum, tungsten or polycrystalline silicon runs to the tungsten contact 5.

Other suitable materials or combinations of such materials may, of course, also be used instead of the stated materials. Thus, for example, the insulator layer 9 may also be composed of silicon nitride or of individual films of silicon dioxide and silicon nitride.

The production of the fuse 4 shown in FIG. 1 starts from a semiconductor substrate which is composed, for example, of silicon, onto which a layer, which can be etched selectively with respect to the substrate and is composed, for example, of silicon nitride, is applied. The silicon nitride layer is structured such that a structured silicon nitride layer 11 remains only on parts of the silicon substrate on which the fuse 4 is intended to be later produced. This is then followed by an etching step, in which the silicon substrate that is not covered by the structured silicon nitride layer 11 is removed down to a specific depth. This results in the structure shown in FIG. 2, in which the structured silicon nitride layer 11 (which is round, for example, in a plan view) covers the semiconductor substrate, which in this case is in the form of a column and, with the designation as in FIG. 1, is composed of the actual semiconductor body 7 and a semiconductor area 12 in the form of a column. The semiconductor area 12 in the form of a column forms the basic structure for the subsequent fuse 4.

Figure 2:
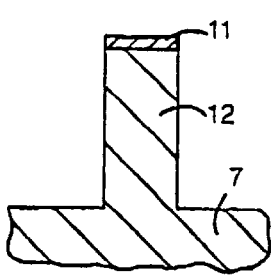
FIGS. 2 to 4 are section views explaining a method for producing the fuse.
Figure 3:
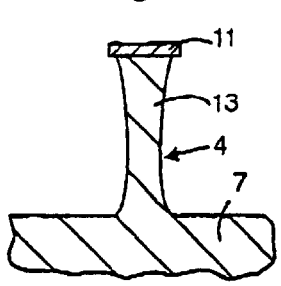
Figure 4:
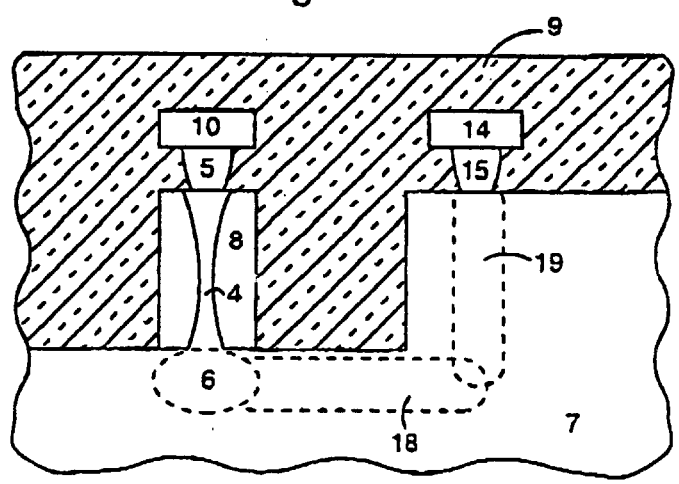

The semiconductor configuration shown in FIG. 2 is preferably formed by anisotropic structuring of the silicon nitride layer 11 and of the semiconductor substrate. The silicon nitride layer can in this case be used for marking.

This is then followed by isotropic etching over, in which the semiconductor area 12 is selectively made "thinner". Therefore, in the step, the cross-sectional area of a remaining semiconductor area 13 is set. In other words, the isotropic etching-over process makes it possible to define, in a simple manner, the desired electrical characteristics of the fuse 4 which will finally be produced in this way.

This is then followed by anisotropic filling with a dielectric composed, for example, of a silicon dioxide layer 9. The anisotropic filling with the dielectric 9 results in a cavity 8 being produced around the fuse 4.

This is followed, in the normal way, by planarization by chemical/mechanical polishing and preparation of the tungsten contact 5 and of the interconnect 10, which are likewise embedded in the insulator layer 9, composed of silicon dioxide. In this case, the semiconductor body 7 can be provided with a further contact 15 and with a further interconnect 14, which are composed of appropriate materials, like the contact 5 and the interconnect 10. The contact 15 together with the interconnect 14 can in this case be connected with a low impedance through a diffusion zone 19 to a projection 18 on the buried layer 6, so that contact is made with both ends of the fuse 4.

Figure 5:
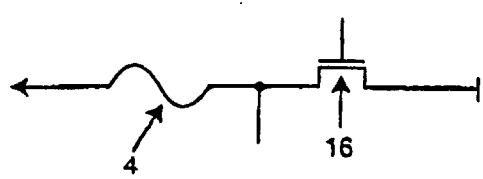
FIG. 5 is a circuit diagram of the fuse with an MOS transistor.

If required, such contact at both ends can be dispensed with if the fuse 4, as is shown schematically in FIG. 5, is connected directly to one electrode of, for example, a transistor 16.

By vertical structuring of the fuse 4, the invention allows a considerable amount of space to be saved in semiconductor configurations. This is especially important in semiconductor memories, since high packing densities are particularly desirable here. In this case, the invention differs completely from the previous structures, which all provide fuses in planar form. The invention provides a capability to produce fuses in a vertical configuration with little effort.

The fuse according to the invention is preferably blown "electrically". However, if required, the fuse may also be blown by the influence of a laser beam. This is particularly appropriate if the fuse 4 is provided somewhat "obliquely" with respect to a main surface 17 of the semiconductor configuration. The main surface 17 runs essentially parallel to an opposite main surface of the semiconductor body 7.

We claim:

1. A semiconductor configuration, comprising:

a semiconductor body having a main surface;

an insulator layer disposed on said main surface of said semiconductor body and having an upper surface, said insulator layer having a cavity formed therein extending to said main surface of said semiconductor body;

a fuse of predetermined length having a fusible part extending from said main surface of said semiconductor body toward said upper surface of said insulator layer at right angles to said main surface of said semiconductor body, said fusible part having a first end facing said semiconductor body and a second end opposite said first end;

said fuse being embedded in said cavity, said cavity surrounding said fuse from said main surface of said semiconductor body toward said upper surface of said insulator layer entirely over said predetermined length of said fuse;

a buried layer being disposed in said semiconductor body and contacting said first end of said fusible part; and a metallic contact being disposed at said second end of said fusible part.

2. The semiconductor configuration according to claim 1, wherein said fusible part is composed of a material selected from the group consisting of doped silicon and undoped silicon.

3. The semiconductor configuration according to claim 2, wherein said fusible part has a length of up to a few $\mu$m and a diameter between approximately 0.1 to 0.5 $\mu$m.

4. The semiconductor configuration according to claim 1, wherein said metallic contact is composed of tungsten.

5. The semiconductor configuration according to claim 1, including an interconnect contacting said metallic contact.

6. The semiconductor configuration according to claim 1, wherein said insulator layer is composed of silicon dioxide.

7. The semiconductor configuration according to claim 1, wherein said fusible part extends to said upper surface of said insulator layer.

* * * * *